(12) United States Patent
Kusumoto et al.

(10) Patent No.: US 6,451,244 B1
(45) Date of Patent: Sep. 17, 2002

(54) CERAMICS WITH EXCELLENT PIEZOELECTRIC PROPERTY AND THEIR MANUFACTURING METHOD

(75) Inventors: Keiji Kusumoto; Tadashi Sekiya, both of Aichi (JP)

(73) Assignee: Japan as represented by Secretary of Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 09/472,811

(22) Filed: Dec. 28, 1999

(30) Foreign Application Priority Data

Dec. 28, 1998 (JP) .......................................... 10-377329

(51) Int. Cl.$^7$ ...................... C04B 35/499; C04B 35/472
(52) U.S. Cl. ........................ 264/614; 264/646; 264/658; 264/674; 264/681; 501/134
(58) Field of Search ............................... 264/658, 681, 264/614, 646, 674; 501/134

(56) References Cited

U.S. PATENT DOCUMENTS

| | | | | |
|---|---|---|---|---|
| 5,112,433 A | * | 5/1992 | Dawson et al. ............. | 501/134 |
| 5,786,048 A | * | 7/1998 | Gesemann et al. ......... | 501/134 |
| 6,093,667 A | * | 7/2000 | Kusumoto et al. .......... | 264/658 |
| 6,288,002 B1 | * | 9/2001 | Kusumoto et al. .......... | 501/134 |

OTHER PUBLICATIONS

Hisao Banno, et al., "Phase Diagram and Piezoelectric Properties of Pb (Nb$_{2/3}$Ni$_{1/3}$)O$_3$–PbTiO$_3$–PbZrO$_3$ and an Application to Ceramic Wave Filter", Proceedings of the 1$^{st}$ Meeting on Ferroelectric Materials and Their Applications, 1984, pp. 339–344.

Masao Kondo, et al. "Temperature Dependence of Piezoelectric Constant of 0.5PbNi$_{1/2}$Nb$_{2/3}$O$_3$–0.5Pb(Zr, Ti)O$_3$ Ceramics in the Vicinity of Morphotrophic Phase Boundary", Jpn. J. Appl. Phys., vol. 38, Part 1, No. 9B, Sep. 1999, pp. 5539–5543.

Masao Kondo, et al., "Piezoelectric Properties of PbNi$_{1/3}$Nb$_{2/3}$O$_3$–PbTiO$_3$–PbZrO$_3$ Ceramics", Jpn. J. Appl. Phys., vol. 36, Part 1, No. 9B, Sep. 1997, pp. 6043–6045.

* cited by examiner

*Primary Examiner*—James Derrington
(74) *Attorney, Agent, or Firm*—Oblon, Spivak, McClelland, Maier & Neustadt, P.C.

(57) ABSTRACT

The present invention is intended to provide piezoelectric ceramic materials having far better strain characteristics than that of conventional piezoelectric ceramics, as well as a novel method for producing such piezoelectric ceramics, and the present invention involves solid solution piezoelectric ceramics primarily comprising the complex perovskite compound Pb(Ni$_{1/3}$Nb$_{2/3}$)O$_3$, the simple perovskite compound PbTiO$_3$, and PbZrO$_3$, wherein the aforementioned ceramics primarily comprise compositions within a triangle in which the compositional vertices are (X=52, Y=34, Z=14), (X=49, Y=37, Z=14), and (X=49, Y=34, Z=17), where Pb(Ni$_{1/3}$Nb$_{2/3}$)O$_3$ is X mol %, PbTiO$_3$ is Y mol %, and PbZrO$_3$ is Z mol % (X+Y+Z=100) among the triangular coordinates in the phase diagram in which the vertices are Pb(Ni$_{1/3}$Nb$_{2/3}$) O$_3$, PbTiO$_3$, and PbZrO$_3$, as well as a method for producing such solid solution ceramics.

12 Claims, 2 Drawing Sheets

Material: $0.5Pb(Ni_{1/3}Nb_{2/3})O_3 \cdot 0.35PbTiO_3 \cdot 0.15PbZrO_3$
Measured at room temperature

CERAMICS WITH EXCELLENT PIEZOELECTRIC PROPERTY AND THEIR MANUFACTURING METHOD

BACKGROUND OF THE INVENTION

1. Field of the Invention

The present invention relates to piezoelectric ceramics which can be used as materials for solid displacement elements such as ceramic actuators, and to a method for producing them, and more particularly to $Pb(Ni_{1/3}Nb_{2/3})O_3$—$PbTiO_3$—$PbZrO_3$ solid solution piezoelectric ceramics demonstrating far better displacement properties than piezoelectric ceramics produced by conventional manufacturing methods, as well as to a method for producing such solid solution ceramics. The piezoelectric ceramics of the present invention are useful as solid displacement elements, and can be applied to solid displacement elements such as actuators to produce solid displacement elements with displacement several times greater than that of conventional solid displacement elements, yielding the promise of lower drive voltage, greater compactness, and thus greater expansion in fields involving the application of solid displacement elements.

2. Description of the Related Art

With the advent of more compact and more intelligent electronic devices recently, the importance of ceramic actuators in the form of solid displacement elements has continued to increase. $PbTiO_3$—$PbZrO_3$ solid solutions (hereinafter referred to as PZT) comprising the perovskite compounds $PbTiO_3$ (hereinafter referred to as PT) and $PbZrO_3$ (hereinafter referred to as PZ) are mainly used at present as ceramic actuator materials. So-called PNN—PT—PZ solid solutions, which are $Pb(Ni_{1/3}Nb_{2/3})O_3$—$PbTiO_3$—$PbZrO_3$ solid solutions (hereinafter sometimes referred to as PNN—PT—PZ) obtained by mixing the complex perovskite compound $Pb(Ni_{1/3}Nb_{2/3})O_3$ (hereinafter sometimes referred to as PNN) to the above solid solutions, have also been attracting more attention recently as materials for the next generation of ceramic actuators, because they can be sintered at lower temperatures than PZT solid solutions and because they show relatively high strain (~0.12%) around a composition consisting of 50 mol % PNN-35 mol % PT-15 mol % PZ.

Although the use of ceramic actuators has been studied in a variety of industrial fields recently, the displacement afforded by conventional piezoelectric ceramics has been unsatisfactory in terms of the displacement properties required in ceramic actuator applications, making the development of novel ceramic actuator materials and the further improvement of the displacement properties of conventional materials increasingly important issues. As a result of extensive research on methods for producing PNN—PT—PZ solid solutions, the inventors have perfected the present invention upon discovering piezoelectric ceramics with far better strain properties, as well as a method for producing such piezoelectric ceramics.

PNN, which is a primary component of PNN—PT—PZ solid solutions, is known to be extremely difficult to obtain in the form of a perovskite single phase in conventional methods for producing ceramics. It is also difficult to obtain high purity ceramics by conventional ceramic manufacturing methods when attempting to produce PNN—PT—PZ solution solutions with a high proportion of PNN.

However, the use of the novel method for producing piezoelectric ceramics developed by the inventors allows high purity PNN—PT—PZ solid solution piezoelectric ceramics to be readily produced, so that ceramics with far better strain properties than conventional PNN—PT—PZ piezoelectric ceramics can be developed.

SUMMARY OF THE INVENTION

An object of the present invention is to provide piezoelectric ceramic materials having far better strain properties than that of conventional piezoelectric ceramics, as well as a novel method for producing such piezoelectric ceramics. The present invention is a solid solution piezoelectric ceramic primarily comprising the complex perovskite compound $Pb(Ni_{1/3}Nb_{2/3})O_3$, the simple perovskite compound $PbTiO_3$, and $PbZrO_3$, wherein the aforementioned ceramic primarily comprises compositions within a triangle in which the compositional vertices are (X=52, Y=34, Z=14), (X=49, Y=37, Z=14), and (X=49, Y=34, Z=17), where $Pb(Ni_{1/3}Nb_{2/3})O_3$ is X mol %, $PbTiO_3$ is Y mol %, and $PbZrO_3$ is Z mol % (X+Y+Z=100) among the triangular coordinates of the phase diagram in which the vertices are $Pb(Ni_{1/3}Nb_{2/3})O_3$, $PbTiO_3$, and $PbZrO_3$, as well as a method for producing such a solid solution ceramic.

The present invention provides high purity piezoelectric ceramics with a high proportion of PNN. When the piezoelectric ceramics developed in the present invention are used as ceramic actuator materials, the resulting ceramic actuators show far greater displacement than conventional ceramic actuators, with the promise of far more compact ceramic actuators and lower drive voltage, making the invention extremely valuable for industrial purposes.

The present invention, which solves the aforementioned drawbacks, comprises the following technical means.

(1) A method for producing $Pb(Ni_{1/3}Nb_{2/3})O_3$—$PbTiO_3$—$PbZrO_3$ solid solution piezoelectric ceramics with high purity of PNN, which comprises preparing lead oxide (PbO), nickel oxide (NiO), niobium oxide ($Nb_2O_5$), titanium oxide ($TiO_2$), and zirconium oxide ($ZrO_2$) as starting materials by measuring out the lead oxide (PbO) in excess of that in the perovskite composition, mixing, forming the materials, heat treating the materials in air, then dissolving unreacted materials in the heat treated materirals to separate particles thereof, molding the resulting particles, and then sintering the molded product to produce a sinter.

(2) The method for producing solid solution piezoelectric ceramics with high purity of PNN according to the above (1), wherein said ceramics primarily comprising compositions within a triangle in which the compositional vertices are (X=52, Y=34, Z=14), (X=49, Y=37, Z=14), and (X=49, Y=34, Z=17), where $Pb(Ni_{1/3}Nb_{2/3})O_3$ is X mol %, $PbTiO_3$ is Y mol %, and $PbZrO_3$ is Z mol % (X+Y+Z=100) among the triangular coordinates in the phase diagram in which the vertices are $Pb(Ni_{1/3}Nb_{2/3})O_3$, $PbTiO_3$, and $PbZrO_3$.

(3) The method according to the above (1), wherein the lead oxide (PbO) is added to the starting materials in excess of that in the perovskite composition of PNN—PT—PZ, and the materials are heat treated for 1 to 2 hours in air at 950 to 1000° C.

The present invention is described in further detail below.

The present invention for solving the aforementioned drawbacks relates to $Pb(Ni_{1/3}Nb_{2/3})O_3$—$PbTiO_3$—$PbZrO_3$ solid solution piezoelectric ceramics demonstrating far better displacement properties than piezoelectric ceramics produced by conventional manufacturing methods, as well as to a method for producing such solid solution ceramics. The high-performance piezoelectric ceramics produced by this method can be used to manufacture ceramic actuators demonstrating displacement several times greater than that of conventional ceramic actuators, resulting in ceramic actuators that have extremely high displacement, that are more compact, and that require a lower drive voltage.

In the method of the present invention, lead oxide (PbO), nickel oxide (NiO), niobium oxide ((Nb$_2$O$_5$), titanium oxide (TiO$_2$), and zirconium oxide (ZrO$_2$) are used as starting materials. These materials are mixed in a predetermined ratio, such as 5 PbO+0.5 NiO+0.5 Nb$_2$O$_5$+1.05 TiO$_2$+0.45 ZrO$_2$, formed into a suitable form such as a tablet or square rod on the like, and suitably heat treated for 1 to 2 hours in air 950 to 1000° C. As preferable examples of methods for mixing the materials, wet milling or dry milling is included, as preferable examples of forming methods, mold pressing or wet pressing is included, and as preferable examples of heat treatment, heat treatment in air is included, but the examples are not limited to the above.

The heat treated materials are treated by an acidic aqueous solution such as a 1 N acetic acid aqueous solution to dissolve unreacted materials trerefrom, and the particles of the heat treated materials are separated by filtration. The resulting particles are molded by a mold presser and sintered for 1 to 3 hours at 1100 to 1300° C. in a PbO atmosphere or in air to produce a sinter. As preferable examples of sintering means, common sintering methods, pressurized sintering methods and the like are included, but the examples are not limited to the above.

In the present invention, it is important that an excess of PbO is added to the perovskite composition of PNN—PT—PZ, as starting materials, and that the materials are heat treated at 950° C. or higher. In this case, for example, the lead oxide (PbO) is preferably added in an excess of about 1 mol relative to 1 mol of the perovskite composition of the aforementioned solid solutions. As will be described below, the perovskite phase yield is clearly increased with materials obtained by adding an excess of PbO to the perovskite composition, thus allowing high purity PNN—PT—PZ solid solution piezoelectric ceramics to be produced.

The piezoelectric ceramics of the present invention are produced by the aforementioned method. Among ceramics primarily comprising Pb(Ni$_{1/3}$Nb$_{2/3}$)O$_3$, PbTiO$_3$, and PbZrO$_3$, those that may suitably be used as such piezoelectric ceramics are piezoelectric ceramics primarily comprising compositions within a triangle in which the compositional vertices are (X=52, Y=34, Z=14), (X=49, Y=37, Z=14), and (X=49, Y=34, Z=17), where Pb(Ni$_{1/3}$Nb$_{2/3}$)O$_3$ is X mol %, PbTiO$_3$ is Y mol %, and PbZrO$_3$ is Z mol % (X+Y+Z=100) among the triangular coordinates of the phase diagram in which the vertices are Pb(Ni$_{1/3}$Nb$_{2/3}$)O$_3$, PbTiO$_3$, and PbZrO$_3$. Trace amounts of manganese oxide (MnO), strontium oxide (SrO), and the like may suitably be added in addition to the PbO, NiO, and Nb$_2$O$_5$ to the aforementioned piezoelectric ceramics in order to improve or stabilize their actuator properties. Within the aforementioned compositional range, the PNN—PT—PZ piezoelectric ceramics of the present invention provide strain greater than that of existing piezoelectric ceramics.

The solid solutions produced by the method of the present invention comprise cubic particles of 0.5 to 1 µm that have excellent dispersion properties, which can be sintered to obtain compact sinters with a relative density of 90% or more.

Since it was extremely difficult to obtain high purity PNN perovskite phases in conventional methods for producing ceramics, it was difficult to produce high purity PNN—PT—PZ solid solution piezoelectric ceramics, but according to the manufacturing method developed by the inventors, it has been possible to produce high purity piezoelectric ceramic starting material powder. As a result, piezoelectric ceramic compositions with substantial strain properties have been discovered, and can be used for ceramic actuators. Strain of the piezoelectric ceramics can be vastly increased by means of the compositional homogeneity and the high purity achieved in the method of synthesis in the present invention.

Differences in the homogeneity of the composition of particles produced by conventional ceramic manufacturing methods and the manufacturing method of the present invention are described in detail below.

The solid phase reaction used in conventional ceramic manufacturing methods is a heterogeneous reaction, in which the synthetic reaction of the solid solutions progress from the contact point between starting material particles. Because the transfer rate of the substances in the solid phase is generally far slower than that in other reaction sites such as gas or liquid phases, it is extremely difficult to synthesize an essentially homogenous solid solution in the solid phase, so there is some degree of compositional variation in the particles thereof produced by conventional ceramic manufacturing methods. Particles thereof thus produced by the conventional ceramic manufacturing methods have a scattered compositional distribution, and since a solid solution composition is intimately related to strain properties, it is difficult to expect an exhibition of the inherent strain properties of the solid solutions.

On the other hand, in the method of the present invention, the liquid phase of lead oxide is utilized as the reaction site. This method yields highly uniform solid solution particles with little compositional variation, because the transfer rate of the substances in the liquid phase is far more rapid than that in the solid phase. As such, the development of the inherent strain properties of solid solutions can be expected of particles produced in the manufacturing method of the present invention, and the strain properties have actually been improved far more than in conventional ceramic manufacturing methods. That is, compared to particles obtained in conventional ceramic manufacturing methods, the solid solution particles produced in the present invention are believed to have higher particle homogeneity and to be qualitatively different.

DESCRIPTION OF THE PREFERRED EMBODIMENTS

Figure 1:
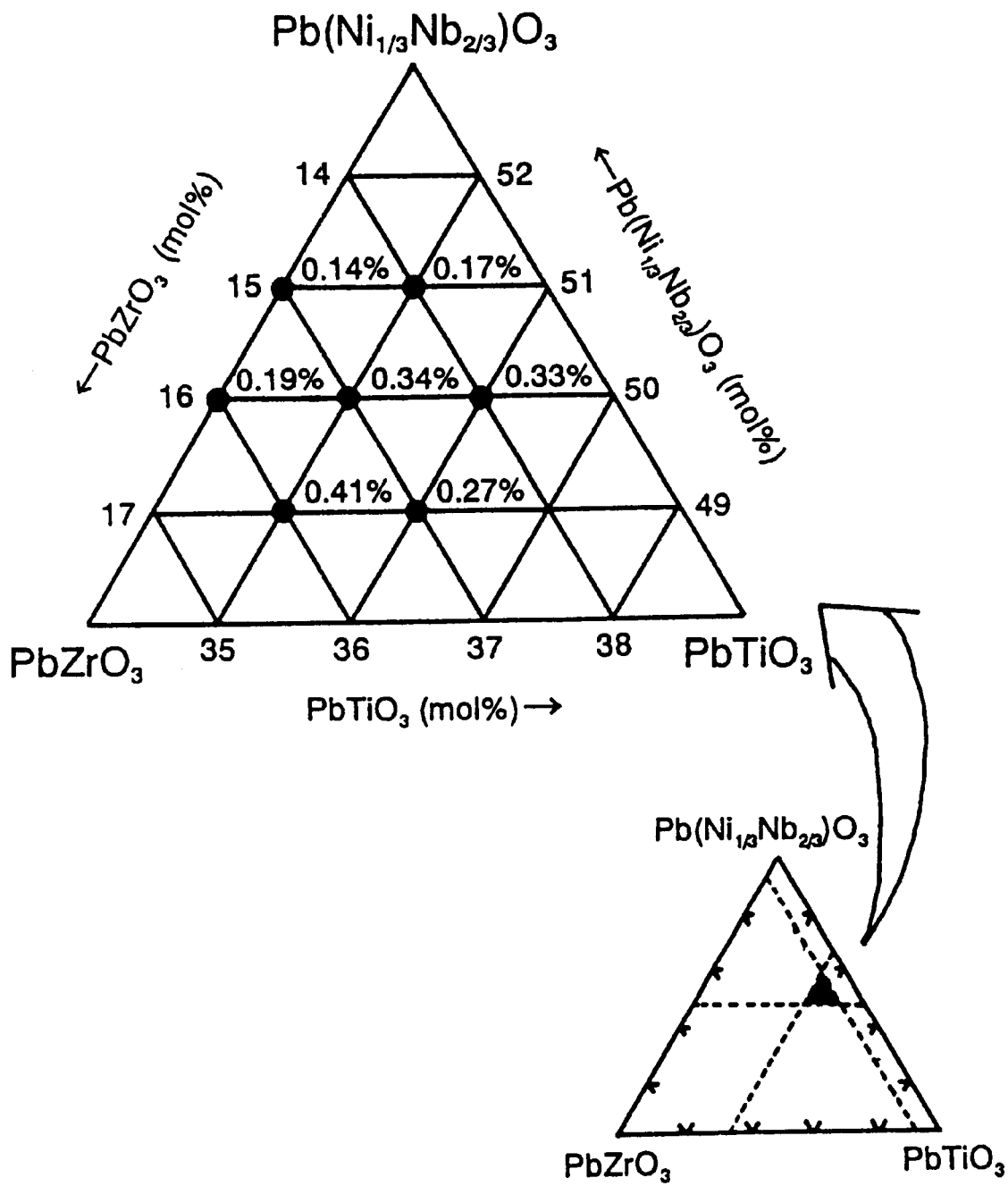
FIG. 1 is a drawing showing the relationship between composition and dielectric strain at an electric field of 1500 V/mm applied at room temperature to sinters prepared by the method in the example.
Figure 2:
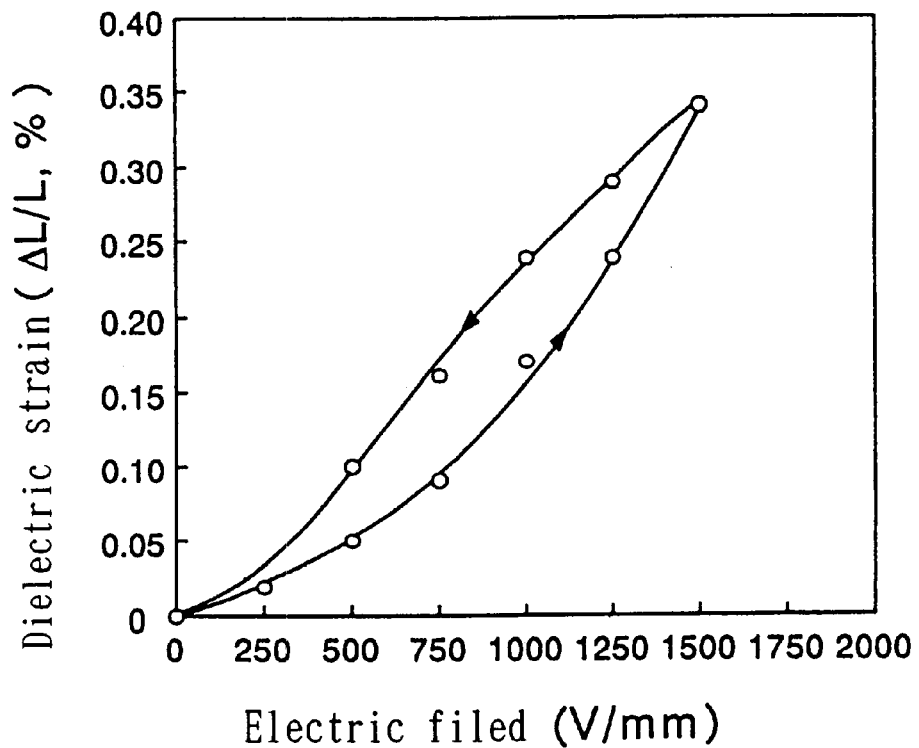
FIG. 2 is a drawing showing the relationship between dielectric strain and an electric field applied to sinters prepared by the method in the example.

The present invention is described in further detail below with reference to the example. The present invention is not limited to this example alone, however.

EXAMPLE

1) Method

The ceramics synthesized in the present example are so-called PNN—PT—PZ solid solutions, which comprise the complex perovskite compound Pb(Ni$_{1/3}$Nb$_{2/3}$)O$_3$ (PNN), the simple perovskite compound PbTiO$_3$ (PT), and PbZrO$_3$ (PZ). In the region of composition containing greater proportions of PNN, such compounds are known to be difficult to obtain in the form of a perovskite single phase in ordinary methods for the synthesis of ceramics, but it has been revealed that by using the following ground-breaking manufacturing method, the perovskite compounds in the form of the perovskite single phase can be obtained according to a relatively simple manufacturing process.

In the present example, particles of around a composition of 50 mol % PNN-35 mol % PT-15 mol % PZ, which has been noticed as a composition suitable for ceramic actuator materials, were synthesized, and sinters of the particles were produced, and then the displacement properties of the sinters were assessed.

2) Synthesis of Particles

Chemical reagents of high purity of lead oxide (PbO), nickel oxide (NiO), niobium oxide ($Nb_2O_5$), titanium oxide ($TiO_2$), and zirconium oxide ($ZrO_2$) were used as starting materials. They were wet milled in the predetermined ratio, formed into tablets, and heat treated for 1 hour at 950° C. in air. The unreacted materials of the heat treated materials were dissolved using a 1 N acetic acid aqueous solution to separate particles thereof.

3) Manufacture of Sinter

The resulting particles were molded, and then sintered for 3 hours at 1220° C. in a PbO atmosphere to produce sinters, and the dielectric and piezoelectric properties thereof were studied using an impedance analyzer and laser type displacement meter, respectively.

Namely, the particles obtained by the aforementioned method of synthesis were pressed to mold the particles into discs 12 mm in diameter at 200 MPa, and then sintered for 3 hours at 1220° C. in a PbO atmosphere to produce the sinters. The surfaces of the sinters were then ground to a thickness of 1 mm, and silver electrodes both sides of the sinters by baking method.

4) Results

In samples comprising an excess of PbO added to the perovskite composition, the yield of the perovskite phase was clearly increased, which resulted in a perovskite single phase when heat treated at 950° C. or higher.

The solid solution produced by this manufacturing method comprises 0.5 to 1 $\mu$m cubic particles with excellent dispersion, and compact sinters with a relative density of 90% or more were obtained by sintering these particles.

5) Properties of the sinters

The obtained sinters were polarized for 1 hour at 2 kV/mm in silicone oil, and the piezoelectric properties of the sinters were then studied. It was revealed that all samples exhibited significant dielectric strain. Particularly in the case of 50 mol % PNN-35 mol % PT-15 mol % PZ sinters, which have been noticed recently as compositions for ceramic actuator materials, it was found that sinters produced by a conventional manufacturing method exhibited about 0.1% strain, whereas sinters produced by the manufacturing method of the present invention exhibited about 0.3% strain, indicating approximately 3-fold improvement in strain properties compared to those of the conventional piezoelectric ceramics.

As described above, the present invention relates to piezoelectric ceramics with far better strain properties than conventional piezoelectric ceramics, as well as to a method for producing a starting material powder therefor. Particular effects afforded by the present invention are that 1) high purity piezoelectric ceramics with a high proportion of PNN can be readily obtained; 2) perovskite single phase particles can be obtained by a relatively simple manufacturing process; 3) the perovskite phase yield is dramatically increased; 4) piezoelectric ceramics with approximately 3 times the strain properties of conventional piezoelectric ceramics can be produced; and 5) the use of the piezoelectric ceramics of the present invention as ceramic actuator materials allows high-performance ceramic actuators with displacement several times greater than in the past to be provided, making the invention profoundly valuable for industrial purposes.

What is claimed is:

1. A method for producing $Pb(Ni_{1/3}Nb_{2/3})O_3$—$PbTiO_3$—$PbZrO_3$ (PNN—PT—PZ) solid solution piezoelectric ceramics comprising a complex perovskite compound $Pb(Ni_{1/3}Nb_{2/3})O_3$ and simple perovskite compounds $PbTiO_3$ and $PbZrO_3$, which comprises:

preparing a mixture of lead oxide (PbO), nickel oxide (NiO), niobium oxide ($Nb_2O_5$), titanium oxide ($TiO_2$), and zirconium oxide ($ZrO_2$) starting materials wherein the lead oxide (PbO) is present in an amount in excess of the stoichiometric amount of Pb in the PNN—PT—PZ solid solution, forming the mixture of starting materials, heat treating the formed mixture of starting materials in air, then dissolving unreacted starting materials in the heat treated thereby providing separate particles of the complex and simple perovskite compounds, molding the resulting particles, and then sintering the molded product to produce a sinter.

2. The method for producing solid solution piezoelectric ceramics according to claim 1, wherein said ceramics have compositions defined by a phase diagram in which the vertices are $Pb(Ni_{1/3}Nb_{2/3})O_3$, $PbTiO_3$, and $PbZrO_3$ and fall within a triangle in which the compositional vertices are (X=52, Y=34, Z=14), (X=49, Y=37, Z=14), and (X=49, Y=34, Z=17), where $Pb(Ni_{1/3}Nb_{2/3})O_3$ is X mol %, $PbTiO_3$ is Y mol %, $PbZrO_3$ is Z mol %, and (X+Y+Z=100).

3. The method for producing solid solution piezoelectric ceramics according to claim 1, wherein said heat treating in air is carried out for 1 to 2 hours at 950 to 1000° C.

4. The method of claim 1 wherein said mixing is wet-milling or dry-milling.

5. The method of claim 1, wherein said forming is mold pressing or wet pressing.

6. The method of claim 1 wherein said dissolving is treating said heat treated materials with an acidic aqueous solution.

7. The method of claim 6, wherein said acidic aqueous solution is 1 N acetic acid.

8. The method of claim 1, wherein said molding is carried out in a mold presser.

9. The method of claim 1, wherein said sintering is carried out at 1100 to 1300° C. in a PbO atmosphere for 1 to 3 hours.

10. The method of claim 1, wherein said sintering is carried out in air for 1 to 3 hours.

11. The method of claim 1, wherein said sintering is pressure sintering.

12. The method of claim 1, wherein said lead oxide is added in an excess of about 1 mol relative to 1 mol of the sum of the moles of simple and complex perovskite compound.

* * * * *